(12) United States Patent
Fujii

(10) Patent No.: US 9,649,660 B2
(45) Date of Patent: May 16, 2017

(54) SUBSTRATE TREATMENT METHOD AND SUBSTRATE TREATMENT APPARATUS

(71) Applicant: DAINIPPON SCREEN MFG. CO., LTD., Kyoto-shi, Kyoto (JP)

(72) Inventor: Tatsuya Fujii, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 411 days.

(21) Appl. No.: 14/039,710

(22) Filed: Sep. 27, 2013

(65) Prior Publication Data

US 2014/0093644 A1 Apr. 3, 2014

(30) Foreign Application Priority Data

Sep. 28, 2012 (JP) ................. 2012-218405

(51) Int. Cl.
| | | |
|---|---|---|
| *B08B 7/04* | (2006.01) | |
| *B08B 7/00* | (2006.01) | |
| *B05D 3/00* | (2006.01) | |
| *B05C 5/00* | (2006.01) | |
| *B05D 1/00* | (2006.01) | |
| *H01L 21/67* | (2006.01) | |

(52) U.S. Cl.
CPC ............... *B05D 3/002* (2013.01); *B05C 5/00* (2013.01); *B05D 1/005* (2013.01); *B08B 7/00* (2013.01); *B08B 7/04* (2013.01); *H01L 21/67028* (2013.01)

(58) Field of Classification Search
CPC ... B08B 3/04; H01L 21/304; H01L 21/67051; H01L 21/6708; H01L 21/67034; B05D 3/00; B05D 3/002; B05D 1/00; B05D 1/005

USPC ............... 134/33, 26, 28, 30, 32, 34, 2
See application file for complete search history.

(56) References Cited

U.S. PATENT DOCUMENTS

| | | | | |
|---|---|---|---|---|
| 8,118,945 B2* | 2/2012 | Eitoku | ............. | H01L 21/67051 134/18 |
| 2011/0061684 A1* | 3/2011 | Tomita | ............. | H01L 21/02052 134/19 |

FOREIGN PATENT DOCUMENTS

| | | |
|---|---|---|
| JP | 2007-227467 A | 9/2007 |
| JP | 2009-110985 A | 5/2009 |
| JP | 2009-212408 A | 9/2009 |

* cited by examiner

*Primary Examiner* — Saeed T Chaudhry
(74) *Attorney, Agent, or Firm* — McDermott Will & Emery LLP

(57) ABSTRACT

A substrate treatment method includes a rinsing step of supplying a rinse liquid to a front surface of a substrate while rotating the substrate at a first rotation speed, a liquid mixture film forming step of forming a liquid film of a liquid mixture of water and an organic solvent having a smaller surface tension than the water on the front surface after the rinsing step by supplying the water and the organic solvent to the front surface while reducing the rotation speed of the substrate from the first rotation speed to a second rotation speed lower than the first rotation speed, and an organic solvent replacing step of replacing the liquid mixture supplied to the front surface with the organic solvent after the liquid mixture film forming step by supplying the organic solvent to the front surface.

6 Claims, 7 Drawing Sheets

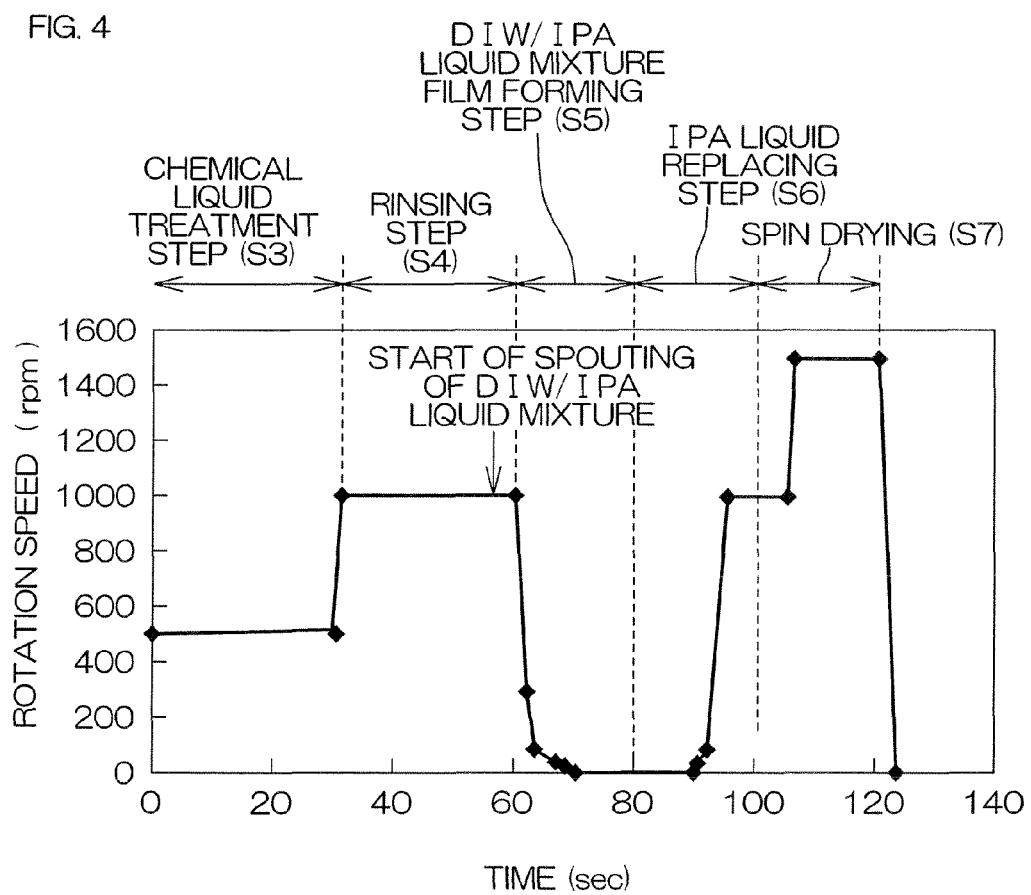

|  | IPA LIQUID MIXING RATIO | FLOW RATE (L/min) | GAS-LIQUID INTERFACE EXPOSURE | DECELERATION PERIOD (sec) |
|---|---|---|---|---|
| COMPARATIVE EXAMPLE 1 | IPA 0% | 2 | × | IMPOSSIBLE |
| COMPARATIVE EXAMPLE 2 |  | 4 | ○ | 73 |
| EXAMPLE 1 | IPA 5% | 2 | ○ | 10 |
| EXAMPLE 2 |  | 4 | ○ | 10 |
| EXAMPLE 3 | IPA 10% | 2 | ○ | 10 |
| EXAMPLE 4 |  | 4 | ○ | 2 |

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus. Exemplary substrates to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices, liquid crystal display devices and the like, a single substrate processing type substrate treatment apparatus which is adapted to treat a single substrate at a time is often used. The conventional substrate treatment apparatus of the single substrate processing type includes a spin chuck which horizontally holds and rotates the substrate, and a nozzle which spouts a treatment liquid to a front surface of the substrate rotated by the spin chuck.

In a substrate treatment process using the substrate treatment apparatus, a chemical liquid treatment process and a rinsing process are performed in this order, for example, by sequentially supplying a chemical liquid and pure water to the front surface of the rotating substrate. Thereafter, an isopropyl alcohol (IPA) liquid is supplied to the front surface of the substrate. After the supply of the IPA liquid, the substrate is kept in a puddle state with the entire front surface thereof covered with a liquid film of the IPA liquid, while being kept in a non-rotation state or in a lower speed rotation state. Then, the substrate in the puddle state is accelerated in its rotation direction, whereby a spin drying process is performed to spin off the IPA liquid present on the substrate.

JP2009-212408A1, for example, proposes a prior-art method in which a liquid film of pure water is formed as covering the entire front surface of the substrate before the formation of the IPA liquid film after the rinsing process in the aforementioned process sequence.

In this prior art method, the pure water is spouted from a nozzle after the rinsing process. At the same time, the substrate is decelerated from a rinsing rotation speed to zero or a lower rotation speed. Therefore, a centrifugal force acting on the pure water present on the substrate is reduced to zero or a lower level. As a result, the pure water present on the front surface of the substrate is stagnated, so that the pure water liquid film is retained on the substrate as covering the entire front surface of the substrate. In turn, the pure water liquid film is replaced with the IPA liquid, whereby a liquid film of the IPA liquid is formed on the substrate as covering the entire front surface of the substrate. At this time, the pure water present on the substrate is partially dissolved in the IPA liquid to form a portion of the IPA liquid film. Therefore, the consumption of the IPA liquid can be saved.

However, it is sometimes difficult to cover the entire front surface of the substrate with the pure water liquid film depending on the surface characteristics and the size of the substrate. Where the front surface of the substrate is hydrophobic, for example, the pure water has a greater contact angle with respect to the front surface of the substrate and is likely to be repelled on the front surface of the substrate. Therefore, the front surface of the substrate is likely to have a portion uncovered with the pure water. Particularly, the portion uncovered with the pure water is likely to be present on a peripheral edge portion of the substrate. In the case of a large-scale substrate (e.g., around substrate having an outer diameter of 450 mm), this tendency is remarkable.

For establishment of the puddle state, the rotation speed of the substrate is reduced from the higher speed to the lower speed. Where the highly hydrophobic substrate or the large-scale substrate described above is used, however, quick deceleration of the substrate is likely to split the liquid film present on the front surface of the substrate to expose a portion of the front surface of the substrate. Where the rotation speed of the substrate is slowly reduced, a longer time is required to establish the puddle state. As the time required for the establishment of the puddle state increases, the entire process time is increased, thereby reducing the throughput of the substrate treatment apparatus (the number of substrates treated per unit time).

SUMMARY OF THE INVENTION

It is an object of the present invention to provide a substrate treatment method and a substrate treatment apparatus which ensure that a puddle state can be established on a substrate in a shorter period of time with a front surface of the substrate entirely covered with a water-containing liquid film.

A first inventive aspect of the present invention provides a substrate treatment method which includes: a rinsing step of supplying a rinse liquid to a front surface of a substrate held by a substrate holding unit while rotating the substrate at a first rotation speed; a liquid mixture film forming step of forming a liquid film of a liquid mixture of water and an organic solvent having a smaller surface tension than the water on the front surface of the substrate held by the substrate holding unit after the rinsing step by supplying the water and the organic solvent to the front surface of the substrate while reducing the rotation speed of the substrate from the first rotation speed to a second rotation speed that is lower than the first rotation speed; and an organic solvent replacing step of replacing the liquid mixture supplied to the front surface of the substrate held by the substrate holding unit in the liquid mixture film forming step with the organic solvent after the liquid mixture film forming step by supplying the organic solvent to the front surface of the substrate.

In the inventive method, the rotation speed of the substrate is reduced to the second rotation speed that is lower than in the rinsing step, while the water and the organic solvent are supplied to the front surface of the substrate. Since the organic solvent has a smaller surface tension, the liquid mixture of the water and the organic solvent also has a relatively small surface tension. Therefore, the liquid mixture of the water and the organic solvent supplied to the front surface of the substrate properly spreads on the front surface of the substrate to reach a peripheral edge portion of the substrate in a shorter period of time, while forming a liquid film on the front surface of the substrate. Thus, the entire front surface of the substrate can be covered with the water-containing liquid film in a shorter period of time. Further, the consumption of the water can be saved.

In the first inventive aspect of the present invention, the liquid mixture film forming step may include the step of supplying the water and the organic solvent in a ratio of (water):(organic solvent)=1:not less than 0.05 to the front surface of the substrate.

Where the ratio of the organic solvent to the water is not less than 0.05, the liquid mixture supplied to the front surface of the substrate in the liquid mixture film forming step has a smaller surface tension. Therefore, the liquid mixture of the water and the organic solvent properly spreads on the front surface of the substrate to reach the peripheral edge portion of the substrate in a shorter period of time, while forming the liquid film on the front surface of the substrate. Thus, the entire front surface of the substrate can be covered with the water-containing liquid film in a shorter period of time. This prevents the liquid film from splitting on the front surface of the substrate to expose a gas-liquid interface even if the substrate is abruptly decelerated in its rotating direction. Thus, the liquid film can be formed on the substrate as covering the entire front surface of the substrate in a shorter period of time.

In the first inventive aspect of the present invention, the rinse liquid may be water. Alternatively, the rinse liquid may include water and an organic solvent.

In the first inventive aspect of the present invention, the supply of the water and the organic solvent may be started before the deceleration of the substrate from the first rotation speed is started in the liquid mixture film forming step.

With the inventive method, the time from the start of the deceleration to the completion of the formation of the liquid film can be reduced. Since the liquid is continuously supplied to the liquid film present on the substrate during a period from the rinsing step to the liquid mixture film forming step, the liquid film is less likely to split during the deceleration of the substrate.

In the first inventive aspect of the present invention, the liquid mixture film forming step may include the step of reducing the rotation speed of the substrate held by the substrate holding unit in a plurality of stages including at least three stages.

In the first inventive aspect of the present invention, the organic solvent replacing step may include the step of rotating the substrate held by the substrate holding unit at a third rotation speed that is higher than the second rotation speed.

As the concentration of the organic solvent in the liquid film increases, the surface tension of the liquid mixture is reduced, and affinity between the substrate and the liquid film is increased. Therefore, the liquid film is less likely to split even if the substrate is rotated at a higher speed. Since the organic solvent is added to the liquid film of the liquid mixture present on the substrate in the organic solvent replacing step, the concentration of the organic solvent in the liquid film is increased. In the organic solvent replacing step, therefore, the liquid film can be retained on the substrate as covering the entire front surface of the substrate without splitting even if the substrate is rotated at a higher rotation speed than in the liquid mixture film forming step.

In the first inventive aspect of the present invention, the front surface of the substrate held by the substrate holding unit may have a hydrophobic portion.

The hydrophobic front surface of the substrate is likely to repel liquid. Thus, even if a treatment liquid is supplied to the front surface of the substrate, the front surface of the substrate is likely to be partially exposed to an ambient atmosphere. In the present invention, the liquid film of the liquid mixture of the water and the organic solvent having a smaller surface tension is formed on the front surface of the substrate. Therefore, the front surface of the substrate can be entirely covered with the liquid film even if the front surface of the substrate is hydrophobic. Thus, particles and other foreign matter are substantially prevented from adhering to a portion of the front surface of the substrate exposed from the liquid film.

A second inventive aspect of the present invention provides a substrate treatment apparatus which includes: a substrate holding unit which holds a substrate; a substrate rotating unit which rotates the substrate held by the substrate holding unit; a rinse liquid supplying unit which supplies a rinse liquid to a front surface of the substrate held by the substrate holding unit; a water/organic solvent supplying unit which supplies water and an organic solvent having a smaller surface tension than the water to the front surface of the substrate held by the substrate holding unit; an organic solvent supplying unit which supplies the organic solvent to the front surface of the substrate held by the substrate holding unit; and a control unit which controls the substrate rotating unit, the rinse liquid supplying unit, the water/organic solvent supplying unit and the organic solvent supplying unit.

The control unit performs: a rinsing step of supplying the rinse liquid to the front surface of the substrate held by the substrate holding unit while rotating the substrate at a first rotation speed; a liquid mixture film forming step of forming a liquid film of a liquid mixture of the water and the organic solvent on the front surface of the substrate held by the substrate holding unit after the rinsing step by supplying the water and the organic solvent to the front surface of the substrate while reducing the rotation speed of the substrate from the first rotation speed to a second rotation speed that is lower than the first rotation speed; and an organic solvent replacing step of replacing the liquid mixture supplied to the front surface of the substrate held by the substrate holding unit in the liquid mixture film forming step with the organic solvent after the liquid mixture film forming step by supplying the organic solvent to the front surface of the substrate.

This arrangement provides the same effects as described above.

In the second inventive aspect of the present invention, the water/organic solvent supplying unit may include a liquid mixture nozzle which spouts the liquid mixture of the water and the organic solvent to the front surface of the substrate held by the substrate holding unit.

With this arrangement, the liquid mixture of the water and the organic solvent is supplied from the liquid mixture nozzle to the front surface of the substrate. Further, the rotation speed of the substrate is reduced to the second rotation speed. Thus, the liquid film of the liquid mixture of the water and the organic solvent is advantageously formed on the front surface of the substrate.

In the second inventive aspect of the present invention, the water/organic solvent supplying unit may include a water nozzle which spouts the water to the front surface of the substrate held by the substrate holding unit, and an organic solvent nozzle which spouts the organic solvent to the front surface of the substrate held by the substrate holding unit.

With this arrangement, the water is supplied from the water nozzle to the front surface of the substrate. Further, the organic solvent is spouted from the organic solvent nozzle to the front surface of the substrate. Further, the rotation speed of the substrate is reduced to the second rotation speed. Thus, the liquid film of the liquid mixture of the water and the organic solvent can be advantageously formed on the front surface of the substrate.

The foregoing and other objects, features and effects of the present invention will become more apparent from the following detailed description of the preferred embodiments with reference to the attached drawings.

BRIEF DESCRIPTION OF THE DRAWINGS

FIG. 4 is a diagram showing changes in the rotation speed of a substrate in the exemplary process shown in FIG. 3.

DETAILED DESCRIPTION OF PREFERRED EMBODIMENTS

Figure 1:
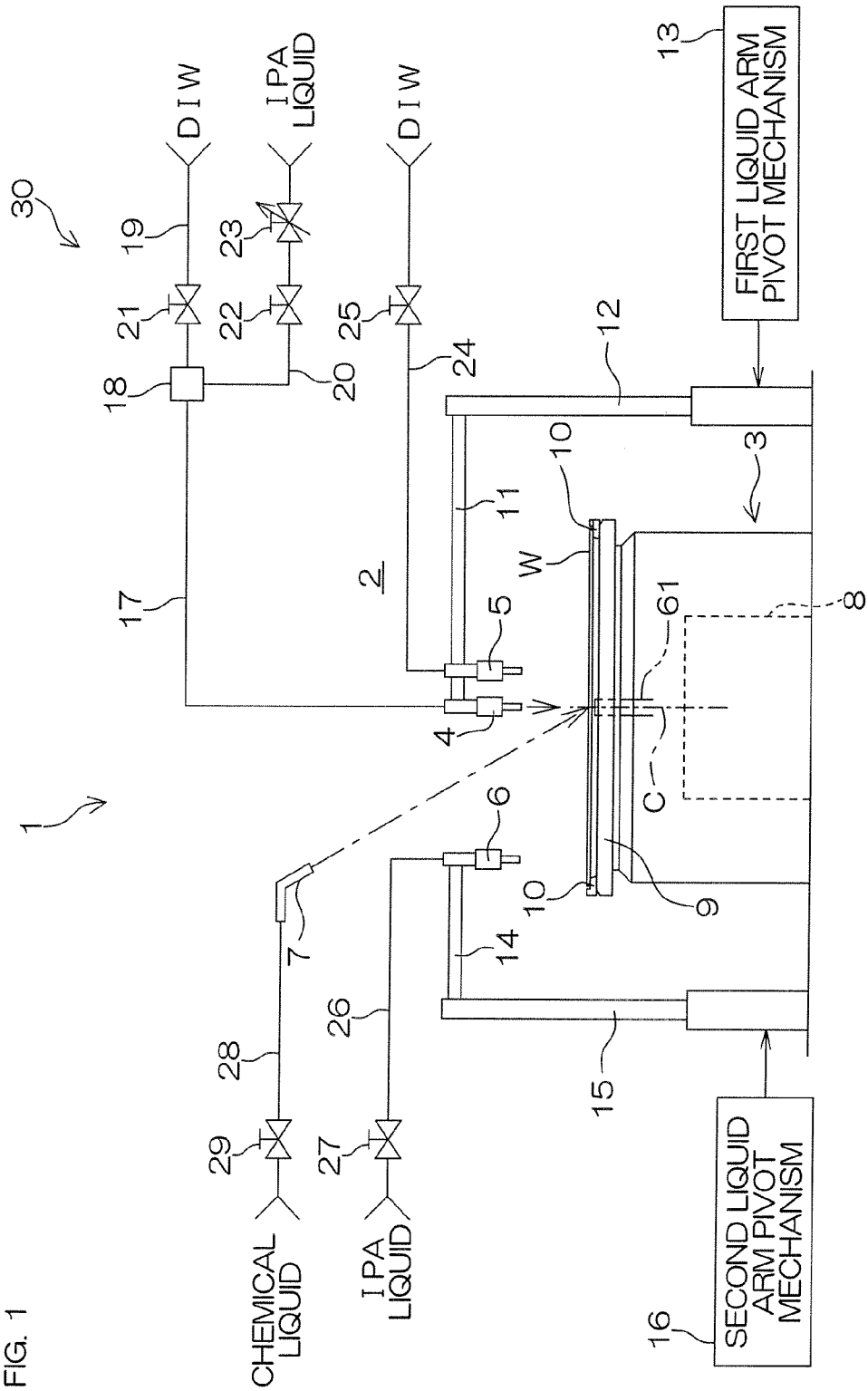
FIG. 1 is a schematic diagram illustrating the inside of a treatment chamber of a substrate treatment apparatus according to one embodiment of the present invention as seen horizontally.

FIG. 1 is a schematic diagram illustrating the inside of a treatment chamber 2 of a substrate treatment apparatus 1 according to one embodiment of the present invention as seen horizontally.

The substrate treatment apparatus is of a single substrate treatment type which performs a cleaning process on a front surface of a substrate W such as a semiconductor wafer.

The substrate treatment apparatus 1 includes a treatment chamber 2 defined by a partition wall (not shown), a spin chuck 3 which holds and rotates the substrate W in the treatment chamber 2, and a chemical liquid nozzle 7 which supplies a chemical liquid to the front surface (upper surface) the substrate W held by the spin chuck 3. The substrate treatment apparatus 1 further includes a liquid mixture nozzle (water/organic solvent supplying unit) 4 which supplies a liquid mixture (hereinafter referred to simply as "IPA/DIW liquid mixture") of an isopropyl alcohol (IPA) liquid (an example of the organic solvent having a smaller surface tension) and deionized water (DIW, an example of the water) to the front surface (upper surface) of the substrate W held by the spin chuck 3, a water nozzle (rinse liquid supplying unit) 5 which supplies DIW to the front surface (upper surface) of the substrate W held by the spin chuck 3, and an organic solvent nozzle (organic solvent supplying unit) 6 which supplies an IPA liquid to the front surface (upper surface) of the substrate W held by the spin chuck 3.

The spin chuck 3 includes a spin motor (substrate rotating unit) 8, a spin shaft (not shown) unitary with a drive shaft of the spin motor 8, a disk-shaped spin base 9 horizontally attached to an upper end of the spin shaft, and a plurality of clamping members 10 generally equidistantly arranged on a peripheral edge portion of the spin base 9. The clamping members 10 clamp the substrate W in a generally horizontal attitude. When the spin motor 8 is driven in this state, the spin base 9 and the clamping members 10 are rotated about a rotation axis C vertically extending through the center of the substrate W to rotate the substrate W in the horizontal attitude together with the spin base 9 and the clamping members 10 about the rotation axis C.

The spin chuck 3 is not limited to the clamping type, but may be of a vacuum suction type which is adapted to suck a back surface of the substrate W to horizontally hold the substrate W and to be rotated about the rotation axis C in this state to rotate the substrate W thus held.

The liquid mixture nozzle 4 is, for example, a straight nozzle which spouts the DIW/IPA liquid mixture in the form of a continuous stream. The liquid mixture nozzle 4 is attached to a distal end portion of a generally horizontally extending first liquid arm 11 with its outlet port directing downward.

A liquid mixture supplying mechanism 30, which supplies the DIW/IPA liquid mixture to the liquid mixture nozzle 4, includes a mixing portion 18 which mixes the DIW and the IPA liquid together, and a liquid mixture supply pipe 17 connected between the mixing portion 18 and the liquid mixture nozzle 4. A first water supply pipe 19 and a first organic solvent supply pipe 20 are connected to the mixing portion 18. The DIW is supplied from a DIW supply source (not shown) to the first water supply pipe 19. The IPA liquid is supplied from an IPA liquid supply source (not shown) to the first organic solvent supply pipe 20. A first water valve 21 which opens and closes the first water supply pipe 19 is provided in the first water supply pipe 19. A first organic solvent valve 22 which opens and closes the first organic solvent supply pipe 20 and a flow rate controlling valve 23 which changes the flow rate of the liquid flowing through the first organic solvent supply pipe 20 are provided in the first organic solvent supply pipe 20.

With the first water valve 21 and the first organic solvent valve 22 open, the DIW supplied from the first water supply pipe 19 and the IPA liquid supplied from the first organic solvent supply pipe 20 flow into the mixing portion 18, and the DIW and the IPA liquid are mixed together in the mixing portion 18. The resulting liquid mixture of the DIW and the IPA liquid flows from the mixing portion 18 to the liquid mixture supply pipe 17. The DIW and the IPA liquid are further mixed together while flowing through the liquid mixture supply pipe 17, and the DIW/IPA liquid mixture resulting from sufficient mixing is supplied to the liquid mixing nozzle 4 through the liquid mixture supply pipe 17.

The water nozzle 5 is, for example, a straight nozzle which spouts the DIW in the form of a continuous stream. The water nozzle 5 is attached to the distal end portion of the generally horizontally extending first liquid arm 11 with its outlet port directing downward. The water nozzle 5 is attached to the first liquid arm in adjacent relation to the liquid mixture nozzle 4. The water nozzle 5 may be attached to a dedicated arm different from the first liquid arm 11.

A second water supply pipe 24 to which the DIW is supplied from the DIW supply source is connected to the water nozzle 5. A second water valve 25 which opens and closes the second water supply pipe 24 is provided in the second water supply pipe 24.

The first liquid arm 11 to which the liquid mixture nozzle 4 and the water nozzle 5 are attached is supported by a first liquid arm support shaft 12 generally vertically extending on a lateral side of the spin chuck 3. A first liquid arm pivot mechanism 13 is connected to the first liquid arm support shaft 12. The first liquid arm pivot mechanism 13 is adapted to rotate the first liquid arm support shaft 12 to horizontally move the liquid mixture nozzle 4 and the water nozzle 5. The first liquid arm pivot mechanism 13 pivots the first liquid arm 11 among a position at which the liquid mixture nozzle 4 is located above the rotation center of the substrate W (on the rotation axis C), a position at which the water nozzle 5 is located above the rotation center of the substrate W (on the rotation axis C), and a predetermined position (home position) at which neither the liquid mixture nozzle 4 nor the water nozzle 5 is opposed to the substrate W.

The organic solvent nozzle 6 is, for example, a straight nozzle which spouts the IPA liquid in the form of a continuous stream. The organic solvent nozzle 6 is attached to a distal end of a generally horizontally extending second liquid arm 14 with its outlet port directing downward. The second liquid arm 14 is supported by a second liquid arm support shaft 15 generally vertically extending on a lateral side of the spin chuck 3. A second liquid arm pivot mechanism 16 is connected to the second liquid arm support shaft 15. The second liquid arm pivot mechanism 16 is adapted to rotate the second liquid arm support shaft 15 to horizontally move the organic solvent nozzle 6. The second liquid arm pivot mechanism 16 pivots the second liquid arm 14 between a position at which the organic solvent nozzle 6 is located above the rotation center of the substrate W (on the rotation axis C) and a predetermined position (home position) at which the organic solvent nozzle 6 is not opposed to the substrate W.

A second organic solvent supply pipe 26 to which the IPA liquid is supplied from the IPA liquid supply source is connected to the organic solvent nozzle 6. A second organic solvent valve 27 which opens and closes the second organic solvent supply pipe 26 is provided in the second organic solvent supply pipe 26.

The chemical liquid nozzle 7 is, for example, a straight nozzle which spouts the chemical liquid in the form of a continuous stream. A chemical liquid supply pipe 28 to which the chemical liquid is supplied from a chemical liquid supply source is connected to the chemical liquid nozzle 7. A chemical liquid valve 29 which opens and closes the chemical liquid supply pipe 28 is provided in the chemical liquid supply pipe 28.

The chemical liquid nozzle 7 is fixed to a position defined so that the chemical liquid spouted from the chemical liquid nozzle 7 is applied to a center portion of the upper surface of the substrate W. However, the chemical liquid nozzle 7 is not necessarily required to be fixed with respect to the spin chuck 3, but may be attached to an arm which is pivotal within a horizontal plane above the spin chuck 3. In this case, a chemical liquid applying position on the front surface of the substrate W is moved between the center portion of the upper surface of the substrate W and the peripheral edge portion of the upper surface of the substrate W by the pivoting of the arm. Alternatively, like the organic solvent nozzle 6, the chemical liquid nozzle 7 may be pivoted between a position at which the chemical liquid nozzle 7 is located above the rotation center of the substrate W (on the rotation axis C) and a position (home position) at which the chemical liquid nozzle 7 is not opposed to the substrate W.

Figure 2:
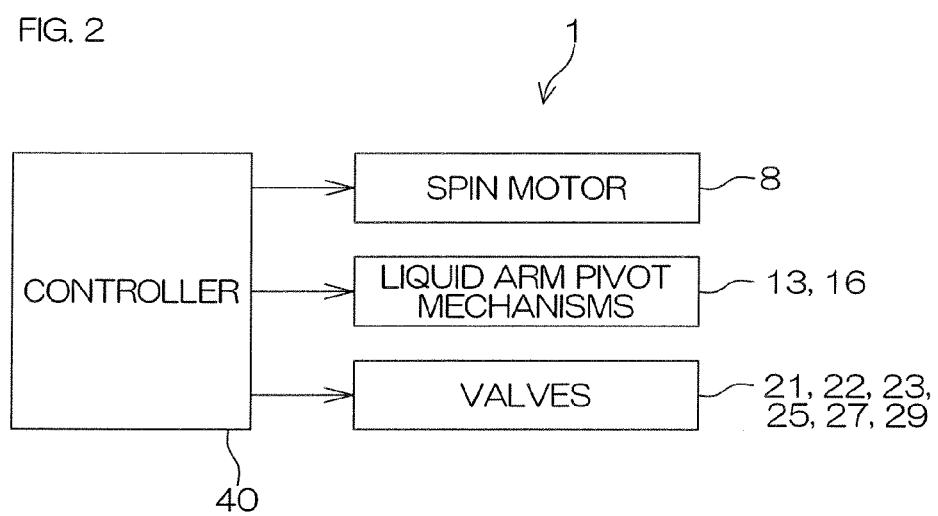
FIG. 2 is a block diagram showing the electrical construction of the substrate treatment apparatus shown in FIG. 1.

FIG. 2 is a block diagram showing the electrical construction of the substrate treatment apparatus 1.

The substrate treatment apparatus 1 includes a controller 40 including a microcomputer. The controller 40 controls the operations of the spin motor 8, the first liquid arm pivot mechanism 13, the second liquid arm pivot mechanism 16 and the like according to predetermined programs. Further, the controller 40 controls the opening and closing operations of the first water valve 21, the first organic solvent valve 22, the second water valve 25, the second organic solvent valve 27, the chemical liquid valve 29 and the like, and controls the opening degree of the flow rate controlling valve 23.

Figure 3:
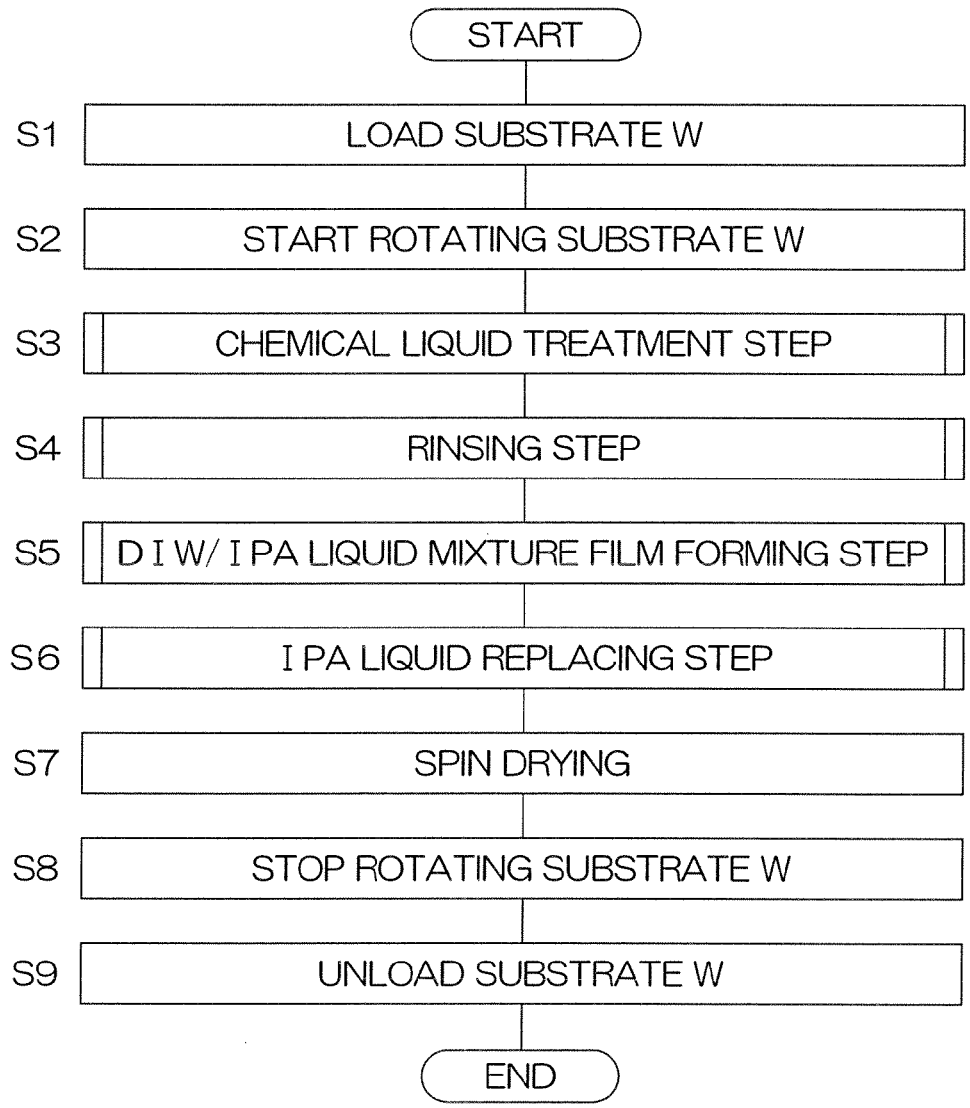
FIG. 3 is a process diagram showing an exemplary cleaning process to be performed by the substrate treatment apparatus shown in FIG. 1.

FIG. 3 is a process diagram showing an exemplary cleaning process to be performed by the substrate treatment apparatus 1. FIG. 4 is a diagram showing changes in the rotation speed of the substrate W in respective steps from a chemical liquid treatment step to a spin drying step. FIGS. 5A to 5D are schematic diagrams for explaining respective steps from a rinsing step to the spin drying step.

Referring to FIGS. 1 to 5D, the exemplary cleaning process will be described.

When the cleaning process is performed by the substrate treatment apparatus 1, the controller 40 causes a transfer robot (not shown) to load an untreated substrate W into the treatment chamber 2 (see FIG. 1) (Step S1). The substrate W may be a large-scale substrate (e.g., around substrate having an outer diameter of 450 mm) or a substrate having a smaller size than the large-scale substrate (a substrate having an outer diameter of less than 450 mm). The substrate W is transferred to the spin chuck 3 by the transfer robot with its front surface facing up. At this time, the liquid mixture nozzle 4, the water nozzle 5 and the organic solvent nozzle 6 are located at their home positions so as not to hinder the loading of the substrate W.

With the substrate W held by the spin chuck 3, the controller 40 controls the spin motor 8 to start rotating the substrate W (Step S2). The substrate W is accelerated to a predetermined chemical liquid treatment rotation speed (e.g., 300 to 1000 rpm and, typically, 500 rpm) in its rotating direction, and maintained at the chemical liquid treatment rotation speed.

Then, the controller 40 opens the chemical liquid valve 29 to spout the chemical liquid from the chemical liquid nozzle 7 toward around the rotation center of the substrate W (Step S3: chemical liquid treatment step). Examples of the chemical liquid include hydrofluoric acid (HF), nitric-hydrofluoric acid (a liquid mixture of hydrofluoric acid and nitric acid ($NHO_3$)) and ammonium fluoride. Where any of these chemical liquids is used, the front surface of the substrate W exhibits a hydrophobic property after the chemical liquid treatment.

The chemical liquid supplied from the chemical liquid nozzle 7 receives a centrifugal force generated by the rotation of the substrate W to flow toward a peripheral edge of the substrate W on the front surface of the substrate W. Thus, the chemical liquid is supplied to the entire front surface of the substrate W, whereby a liquid film of the chemical liquid is formed on the substrate W as covering the entire front surface of the substrate W. Thus, the entire front surface of the substrate W is subjected to the chemical liquid treatment.

After a lapse of a predetermined chemical liquid treatment period (e.g., about 30 seconds) from the start of the spouting of the chemical liquid, the controller 40 closes the chemical liquid valve 29 to stop spouting the chemical liquid from the chemical liquid nozzle 7. The chemical liquid treatment makes the front surface of the substrate W hydrophobic.

Then, the controller 40 controls the spin motor 8 to accelerate the substrate W to a predetermined rinsing rotation speed (first rotation speed, e.g., 1000 rpm). In this exemplary process, the rinsing rotation speed is higher than the chemical liquid treatment rotation speed.

Figure 5A:
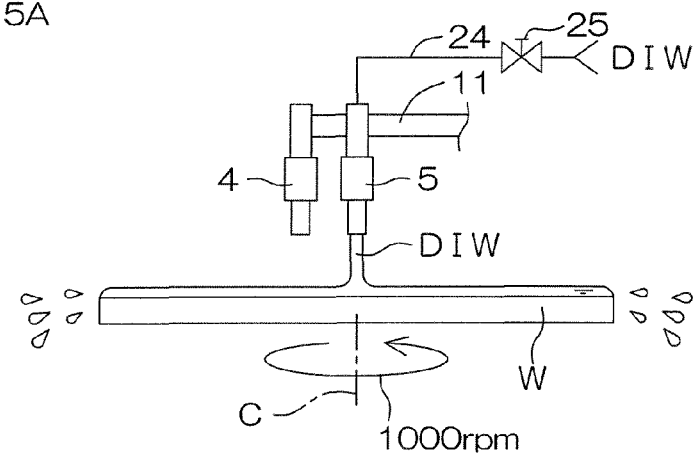
FIGS. 5A, 5B, 5C and 5D are schematic diagrams for explaining the exemplary process shown in FIG. 3

When the rotation speed of the substrate W reaches the rinsing rotation speed, the controller 40 starts a rinsing step (Step S4). More specifically, the controller 40 controls the first liquid arm pivot mechanism 13 to move the liquid mixture nozzle 4 and the water nozzle 5 to above the substrate W to locate the water nozzle 5 above the rotation center of the substrate W (on the rotation axis C) as shown in FIG. 5A. Subsequently, the controller 40 opens the second water valve 25 to start spouting the DIW from the water nozzle 5. At this time, the supply flow rate of the DIW to be supplied from the water nozzle 5 is set, for example, to 2.0 (L/min). The DIW supplied to the center portion of the front surface of the substrate W receives a centrifugal force generated by the rotation of the substrate W to flow toward the peripheral edge of the substrate W on the front surface of the substrate W. Thus, the DIW spreads over the entire front surface of the substrate W to rinse away the chemical liquid adhering to the front surface of the substrate W. Therefore, the chemical liquid film present on the substrate W is replaced with a liquid film of the DIW covering the entire front surface of the substrate W. In the rinsing step of Step S4, the DIW is spouted from the water nozzle 5 toward the rotation center of the substrate W for a predetermined rinsing period (e.g., 30 seconds). After a lapse of the rinsing period, the controller 40 closes the second water valve 25 to stop spouting the DIW from the water nozzle 5.

Figure 5B:
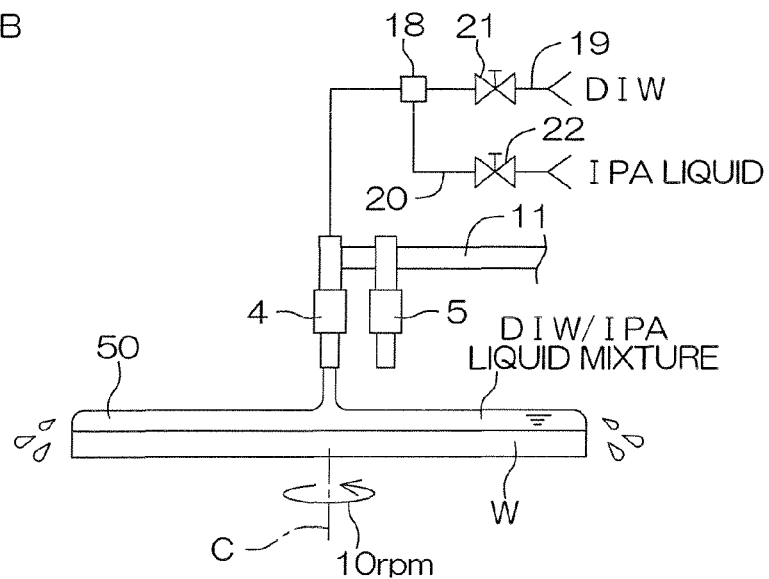

Thereafter, the controller 40 pivots the first liquid arm 11 by only a small angle to locate the liquid mixture nozzle 4 above the rotation center of the substrate W as shown in FIG. 5B. Then, the controller 40 opens the first water valve 21 and the first organic solvent valve 22 to start spouting the DIW/IPA liquid mixture from the liquid mixture nozzle 4. Thus, the DIW/IPA liquid mixture is supplied from the liquid mixture nozzle 4 to around the rotation center of the substrate W. The supply flow rate of the DIW/IPA liquid mixture is set, for example, to 2.0 (L/min).

After the DIW/IPA liquid mixture is supplied from the liquid mixture nozzle 4 to the substrate W for about 5 seconds, the controller 40 starts a DIW/IPA liquid mixture film forming step (Step S5). More specifically, the controller 40 controls the spin motor 8 to abruptly decelerate the substrate W from the rinsing rotation speed (first rotation speed, e.g., 1000 rpm) to a liquid mixture paddle rotation speed (second rotation speed, e.g., about 10 rpm) in about 10 seconds, while spouting the DIW/IPA liquid mixture from the liquid mixture nozzle 4. At this time, the resulting liquid film of the DIW/IPA liquid mixture is not split by the abrupt deceleration for the following reason. The centrifugal force is reduced by the deceleration of the substrate W, so that the amount of the DIW/IPA liquid mixture splashing from the substrate W is reduced. Therefore, the DIW/IPA liquid mixture supplied from the liquid mixture nozzle 4 is accumulated on the front surface of the substrate W. When the DIW/IPA liquid mixture film is completely formed on the substrate W as covering the entire front surface of the substrate W after a lapse of a predetermined period (20 seconds in this embodiment) from the start of the deceleration, the controller 40 closes the first water valve 21 and the first organic solvent valve 22 to stop spouting the DIW/IPA liquid mixture from the liquid mixture nozzle 4. The controller 40 controls the first liquid arm pivot mechanism 13 to move the liquid mixture nozzle 4 and the water nozzle 5 back to their home positions.

The controller 40 may reduce the rotation speed of the substrate W at a constant rate from the rinsing rotation speed to the liquid mixture paddle rotation speed, or may reduce the rotation speed of the substrate W at a variable rate from the rinsing rotation speed to the liquid mixture paddle rotation speed. In this embodiment, the abrupt deceleration from the rinsing rotation speed to the liquid mixture paddle rotation speed is achieved in six stages. As shown in FIG. 4, the rotation speed of the substrate W is reduced from the rinsing rotation speed (e.g., about 1000 rpm) to a first intermediate speed of the first stage (e.g., about 300 rpm), to a second intermediate speed of the second stage (e.g., about 100 rpm), to a third intermediate speed of the third stage (e.g., about 50 rpm), to a fourth intermediate speed of the fourth stage (e.g., about 30 rpm), to a fifth intermediate speed of the fifth stage (e.g., about 20 rpm), and to the liquid mixture puddle rotation speed (a target speed of the sixth stage, e.g., about 10 rpm) in about 10 seconds.

In this embodiment, the opening degree of the flow rate controlling valve 23 is defined so that the mixing ratio (weight ratio) between the DIW and the IPA liquid in the DIW/IPA liquid mixture is 20:1. Therefore, the DIW/IPA liquid mixture having an IPA liquid concentration (hereinafter sometimes referred to simply as "IPA mixing ratio") of about 5% is spouted from the liquid mixture nozzle 4. The DIW/IPA liquid mixture to be spouted from the liquid mixture nozzle 4 desirably has an IPA mixing ratio of not less than 5%.

Since the IPA liquid having a smaller surface tension than water is contained in the DIW/IPA liquid mixture having an IPA liquid concentration of about 5%, the DIW/IPA liquid mixture has a surface tension that is merely about 60 to 70% of the surface tension of the DIW. Therefore, the DIW/IPA liquid mixture supplied to the substrate W properly spreads on the front surface of the substrate W, so that the entire front surface including the peripheral edge portion of the substrate W is covered with the DIW/IPA liquid mixture. Even if the substrate W is abruptly decelerated, therefore, the liquid film does not split on the front surface of the substrate W. Therefore, a gas-liquid interface is not formed on the front surface of the substrate W, so that the front surface of the substrate W is not partially exposed with the substrate W kept in a puddle state. Thus, the liquid film can be formed as covering the entire front surface of the substrate W in a shorter period of time. In this embodiment, the liquid film 50 of the DIW/IPA liquid mixture is formed as covering the entire front surface of the substrate W after a lapse of about 20 seconds from the start of the deceleration of the substrate W (after a lapse of about 10 seconds from completion of the deceleration of the substrate W).

Figure 5C:
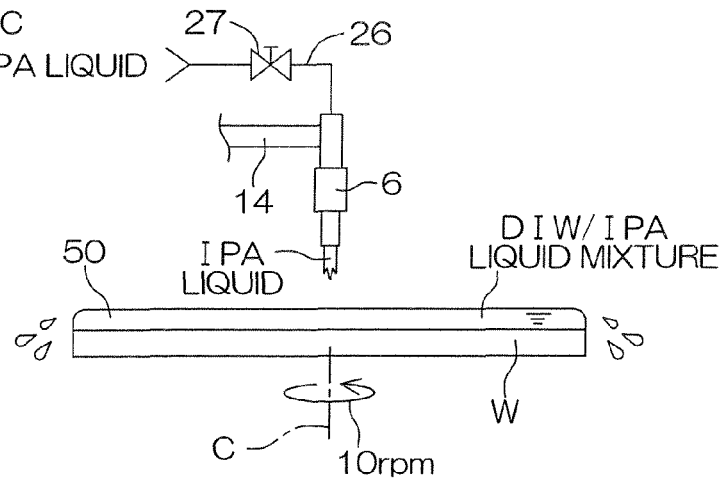

Subsequently, the controller 40 starts an IPA liquid replacing step (Step S6). More specifically, the controller 40 first moves the organic solvent nozzle 6 to above the rotation center of the substrate W (to the rotation axis C) as shown in FIG. 5C.

The controller 40 controls the spin motor 8 to rotate the substrate W at an IPA liquid puddle rotation speed (third rotation speed). The IPA liquid puddle rotation speed is substantially equal to the liquid mixture puddle rotation speed (second rotation speed: about 10 rpm) employed in the DIW/IPA liquid mixture film forming step of Step S5.

The controller 40 opens the second organic solvent valve 27 to spout the IPA liquid from the organic solvent nozzle 6 with the rotation speed of the substrate W maintained at the IPA liquid puddle rotation speed.

Figure 5D:
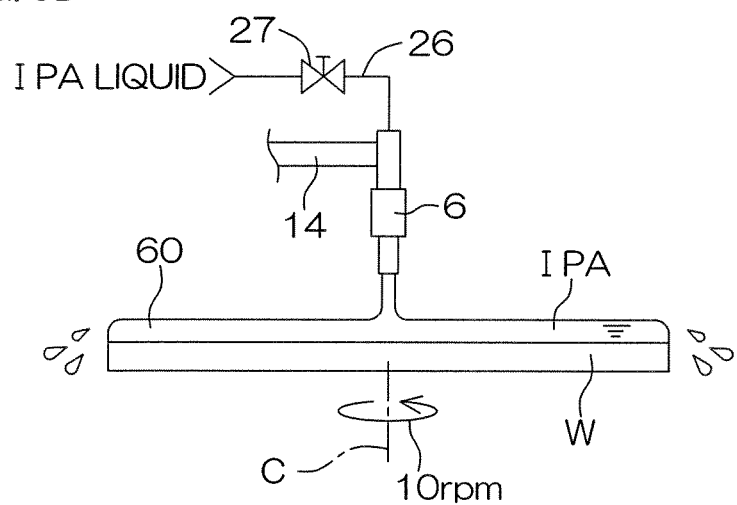

At this time, the flow rate of the IPA liquid to be supplied from the organic solvent nozzle 6 is set to 0.1 (L/min). Thus, the DIW/IPA liquid mixture present on the substrate W is replaced with the IPA liquid spouted from the organic solvent nozzle 6 as shown in FIG. 5D. Thus, a liquid film 60 of the IPA liquid covering the entire front surface of the substrate W is formed from the IPA liquid spouted from the organic solvent nozzle 6.

After a lapse of a predetermined IPA puddle period (e.g., about 8 seconds) from the start of the spouting of the IPA liquid from the organic solvent nozzle 6, the controller 40 controls the spin motor 8 to abruptly accelerate the substrate W in the rotating direction from the IPA liquid puddle rotation speed (third rotation speed) to a higher rotation speed (e.g., about 1000 rpm) in three stages, for example, while continuing the spouting of the IPA liquid. That is, the controller 40 increases the rotation speed of the substrate W from the IPA liquid puddle rotation speed (e.g., about 10 rpm) to a first intermediate speed of the first stage (e.g., about 50 rpm), to a second intermediate speed of the second stage (e.g., about 100 rpm) and to the higher rotation speed (a target speed of the third stage, e.g., about 1000 rpm) in about eight seconds as shown in FIG. 4.

After the rotation speed of the substrate W reaches the higher rotation speed, the controller 40 closes the second organic solvent valve 27 to stop spouting the IPA liquid from the organic solvent nozzle 6. Further, the controller 40 controls the second liquid arm pivot mechanism 16 to move the organic solvent nozzle 6 back to its home position after the spouting of the IPA liquid is stopped.

Then, the controller 40 starts a spin drying step (Step S7). That is, the controller 40 controls the spin motor 8 to increase the rotation speed of the substrate W from toe higher rotation speed (1000 rpm) to a predetermined drying rotation speed (e.g., 1500 rpm). Thus, the IPA liquid adhering to the substrate W is spun off around the substrate W by a centrifugal force to be removed from the substrate W, whereby the substrate W is dried.

After the spin drying step is performed for a predetermined drying period, the controller 40 controls the spin motor 8 to stop rotating the spin chuck 3 (Step S8). Thus, the cleaning process on the single substrate W is completed. Thereafter, the controller 40 causes the transfer robot to unload the treated substrate W from the treatment chamber 2 (Step S9).

In this embodiment, as described above, the rotation speed of the substrate W is reduced to the liquid mixture puddle rotation speed lower than the rinsing rotation speed, while the DIW/IPA liquid mixture is supplied to the front surface of the substrate W subjected to the rinsing step. Since the IPA liquid has a smaller surface tension, the DIW/IPA liquid mixture also has a relatively small surface tension. Therefore, the DIW/IPA liquid mixture supplied to the front surface of the substrate W properly spreads on the front surface of the substrate W. Even if the substrate W to be treated has a hydrophobic surface or has a greater diameter, the DIW/IPA liquid mixture film 50 can be completely formed on the substrate W as covering the front surface of the substrate W in a shorter period of time. As a result, the consumption of the DIW can be saved.

Next, a puddle test will be described. The exemplary process shown in FIG. 3 was performed by means of the substrate treatment apparatus 1. In the puddle test, the liquid mixture film forming step of Step S5 in FIG. 3 was performed under different conditions described below in Examples 1 to 4 and Comparative Examples 1 and 2. Silicon wafers W (having an outer diameter of 450 mm) each having an oxide film formed in a front surface thereof were used as test samples, and hydrofluoric acid was used as the chemical liquid for the cleaning process.

Example 1

The supply flow rate of the DIW/IPA liquid mixture supplied to the front surface of the substrate W was 2.0 (L/min). The IPA mixing ratio of the DIW/IPA liquid mixture was 5% (or the mixing ratio between the DIW and the IPA liquid was 20:1).

Example 2

The supply flow rate of the DIW/IPA liquid mixture supplied to the front surface of the substrate W was 4.0 (L/min). The IPA mixing ratio of the DIW/IPA liquid mixture was 5% (or the mixing ratio between the DIW and the IPA liquid was 20:1).

Example 3

The supply flow rate of the DIW/IPA liquid mixture supplied to the front surface of the substrate W was 2.0 (L/min). The IPA mixing ratio of the DIW/IPA liquid mixture was 10% (or the mixing ratio between the DIW and the IPA liquid was 10:1).

Example 4

The supply flow rate of the DIW/IPA liquid mixture supplied to the front surface of the substrate W was 4.0 (L/min). The IPA mixing ratio of the DIW/IPA liquid mixture was 10% (or the mixing ratio between the DIW and the IPA liquid was 10:1).

Comparative Example 1

The DIW (having an IPA mixing ratio of 0%) was supplied to the front surface of the substrate W. The supply flow rate of the DIW supplied to the front surface of the substrate W was 2.0 (L/min).

Comparative Example 2

The DIW (having an IPA mixing ratio of 0%) was supplied to the front surface of the substrate W. The supply flow rate of the DIW supplied to the front surface of the substrate W was 4.0 (L/min).

In Examples 1 to 4 and Comparative Examples 1 and 2, a liquid film forming state was observed. When the rotation speed of the substrate W was reduced from the first rotation speed to the second rotation speed with the liquid film 50 (see FIG. 5B and the like) retained on the substrate W as covering the entire front surface of the substrate W without the exposure of the front surface of the substrate W, the time from the start of the deceleration to the end of the deceleration (deceleration period in FIG. 6) was measured.

Figures 6, 7:
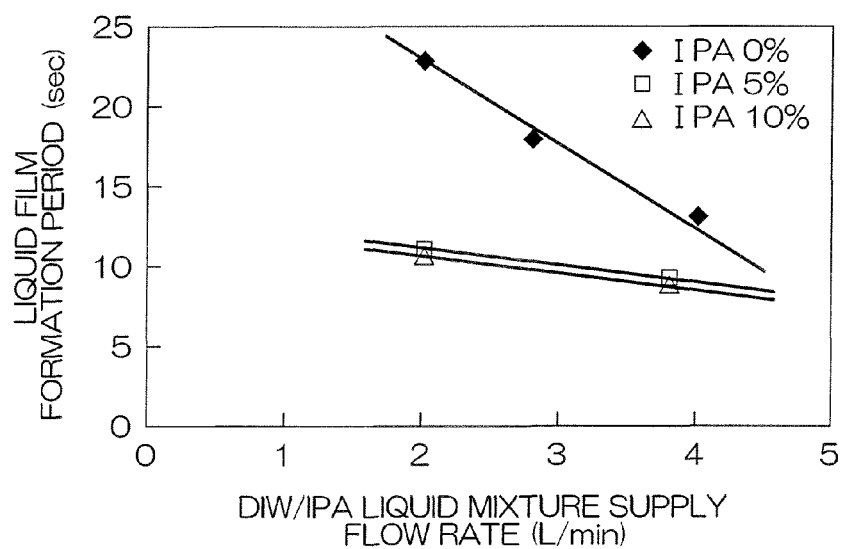
FIG. 6 is a diagram showing the results of a puddle test.
FIG. 7 is a graph showing relationships between the supply flow rate of a DIW/IPA liquid mixture and the liquid film formation period with respect to different IPA mixing ratios.

In Examples 1 to 4, the liquid film 50 of the DIW/IPA liquid mixture was successfully retained on the entire front surface of the substrate W without the exposure of the front surface of the substrate W (without gas-liquid interface exposure shown in FIG. 6).

In Examples 1 to 4, the deceleration period (the time from the start of the deceleration to the end of the deceleration when the rotation speed of the substrate W was reduced from the first rotation speed to the second rotation speed without the gas-liquid interface exposure from the liquid film 50) was not longer than 10 seconds as shown in FIG. 6. In Example 4, particularly, the time required for the deceleration of the substrate W was shorter than in Examples 1 to 3.

FIG. 7 is a graph showing relationships between the supply flow rate of the DIW/IPA liquid mixture and the liquid film formation period (the time from the end of the deceleration of the substrate W to the completion of the replacement of the DIW liquid film with the DIW/IPA liquid mixture film 50 in the DIW/IPA liquid mixture film forming step of Step S5) with respect to different IPA mixing ratios. In FIG. 7, a symbol ♦ indicates a case in which the DIW was supplied to the front surface of the substrate W (with an IPA mixing ratio of 0%), and a symbol □ indicates a case in which the IPA mixing ratio of the DIW/IPA liquid mixture supplied to the front surface of the substrate W was 5% (or the mixing ratio between the DIW and the IPA liquid was 20:1). Further, a symbol Δ indicates a case in which the IPA mixing ratio of the DIW/IPA liquid mixture supplied to the front surface of the substrate W was 10% (or the mixing ratio between the DIW and the IPA liquid was 10:1).

FIG. 7 indicates that, even if the supply flow rate of the DIW/IPA liquid mixture is 2.0 (L/min), the liquid film forming period can be reduced to about 10 seconds with an IPA mixing ratio of not less than 5%.

FIGS. 6 and 7 indicate that, if the IPA mixing ratio of the DIW/IPA liquid mixture supplied to the substrate W is not less than 5%, the liquid film 50 (the DIW/IPA liquid mixture film) can be completely formed as covering the entire front surface of the substrate W in a shorter period of time.

While the embodiment of the present invention has thus been described, the invention may be embodied in other ways.

In the embodiment described above, the liquid film 50 of the DIW/IPA liquid mixture is formed on the front surface of the substrate W by using the DIW/IPA liquid mixture spouted from the liquid mixture nozzle 4 by way of example. Alternatively, the DIW/IPA liquid mixture may be prepared by mixing the DIW spouted from the water nozzle 5 and the IPA liquid spouted from the organic solvent nozzle 6 together on the front surface of the substrate W, and used to form the DIW/IPA liquid mixture film 50 on the front surface of the substrate W.

In this case, the supply of the DIW from the water nozzle 5 is continued from the start of the rinsing step (Step S4 in FIG. 3) to the end of the DIW/IPA liquid mixture film forming step (Step S5 in FIG. 3).

In the embodiment described above, the spouting of the DIW/IPA liquid mixture from the liquid mixture nozzle 4 is started after the spouting of the DIW from the water nozzle 5 ends. Alternatively, the spouting of the DIW/IPA liquid mixture from the liquid mixture nozzle 4 may be started (e.g., 3 seconds) before the end of the spouting of the DIW from the water nozzle 5.

In the embodiment described above, the water nozzle 5 and the liquid mixture nozzle 4 are separately provided, but only the liquid mixture nozzle 4 may be provided without the provision of the water nozzle 5. In this case, the DIW is spouted from the liquid mixture nozzle 4 by opening the first water valve 21 with the first organic solvent valve 22 closed to supply only the DIW to the liquid mixture supply pipe 17.

Simultaneously with the supply of the IPA liquid for the formation of the IPA liquid film, warm water (DIW having a temperature higher than the ordinary temperature) may be supplied to the back surface (lower surface) of the substrate W opposite from the front surface. That is, the warm water may be spouted upward from a lower side nozzle 61 (see FIG. 1) disposed below the substrate W toward a center portion of the lower surface of the substrate W. In this case, the temperature of the substrate can be increased by supplying the warm water to the back surface of the substrate W. Therefore, the IPA liquid film 60 formed on the front surface of the substrate W can be heated via the substrate W. Thus, the temperature of the IPA liquid present on the front surface of the substrate W can be increased to a temperature not lower than the ordinary temperature (a given temperature in a range of 20° C. to 30° C., e.g., 25° C.). As a result, the efficiency of replacing the DIW with the IPA liquid on the front surface of the substrate W can be improved.

The substrate W is decelerated from the rinsing rotation speed to the liquid mixture puddle rotation speed in the six stages not by way of limitation. For example, the substrate W may be decelerated from the rinsing rotation speed to the liquid mixture puddle rotation speed in two stages. In this case, the rotation speed of the substrate W is reduced from the rinsing rotation speed (e.g., about 1000 rpm) to a first intermediate speed (e.g., about 300 rpm) of the first stage, and to the puddle rotation speed (a target rotation speed of the second stage, e.g., about 10 rpm).

As described above, the substrate W is rinsed with the water (DIW) by way of example, but the DIW/IPA liquid mixture may be used for the rinsing of the substrate W. In this case, the DIW/IPA liquid mixture supplied from the liquid mixture nozzle 4 may be used for the rinsing, and the supply of the DIW/IPA liquid mixture from the liquid mixture nozzle 4 is continued from the start of the rinsing step (Step S4 in FIG. 3) to the end of the DIW/IPA liquid mixture film forming step (Step S5 in FIG. 3).

In the DIW/IPA liquid mixture film forming step (Step S5 in FIG. 3), the substrate W is rotated at the liquid mixture puddle ration speed (second rotation speed) that is equal to the IPA liquid puddle rotation speed (third rotation speed) employed in the IPA liquid replacing step (Step S6 in FIG. 3) in the embodiment described above. However, the substrate W may be rotated at a rotation speed higher than the liquid mixture puddle rotation speed in the IPA liquid replacing step. That is, the IPA liquid puddle rotation speed may be higher than the liquid mixture puddle rotation speed.

As the IPA concentration of the DIW/IPA liquid mixture increases, the surface tension of the DIW/IPA liquid mixture is reduced. Therefore, the liquid film less likely to split even if the substrate W is rotated at a higher speed. In the IPA liquid replacing step, the liquid film has a higher IPA concentration by the addition of the IPA and, therefore, the liquid film can be retained on the substrate W as covering the entire front surface of the substrate W without splitting, even if the substrate W is rotated at a rotation speed higher than in the DIW/IPA liquid mixture film forming step.

Examples of the organic solvent having a smaller surface tension include methanol, ethanol, acetone, HFE (hydrofluoroether) in addition to the IPA liquid.

The DIW is used as the water by way of example but not by way of limitation. Other examples of the water include carbonated water, electrolytic ion water, ozone water, a hydrochloric acid solution having a dilute concentration (e.g., about 10 to about 100 ppm), and reduced water (hydrogen water).

In the embodiment described above, the mixing ratio between the DIW and the IPA liquid in the DIW/IPA liquid mixture is controlled by varying the flow rate of the IPA liquid by way of example. Alternatively, the mixing ratio between the DIW and the IPA liquid in the DIW/IPA liquid mixture may be controlled by varying the flow rate of the DIW. Of course, the mixing ratio between the DIW and the IPA liquid in the DIW/IPA liquid mixture may be controlled by varying the flow rate of the IPA liquid and the flow rate of the DIW.

The present invention is applied to the cleaning process for removing the silicon oxide film from the front surface of the substrate W not by of limitation, but is applicable to other processes. The effects of the present invention are remarkable particularly where the front surface of the substrate W is hydrophobic. Exemplary processes to be performed on a substrate W having a hydrophobic surface include a resist removing process in addition to the silicon oxide film removing process.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2012-218405 filed in the Japanese Patent Office on Sep. 28, 2012, the disclosure of which is incorporated herein by reference in its entirety.

What is claimed is:

1. A substrate treatment method comprising:
  a water rinsing step of supplying a rinse liquid, which is a deionized water, to a front surface of a substrate held by a substrate holding unit while rotating the substrate at a first rotation speed such that the rinse liquid spreads over the entire front surface of the substrate;
  a liquid mixture film forming step of forming a liquid film of a liquid mixture of water and an isopropyl alcohol having a smaller surface tension than the water on the entire front surface of the substrate held by the substrate holding unit after the water rinsing step by supplying the water and the isopropyl alcohol to the entire front surface of the substrate while reducing the rotation speed of the substrate from the first rotation speed to a second rotation speed that is lower than the first rotation speed, wherein a mixing ratio of the isopropyl alcohol to the water ranges, by weight, from 5% to 10%; and
  an isopropyl alcohol replacing step of replacing the liquid mixture supplied to the front surface of the substrate held by the substrate holding unit in the liquid mixture film forming step with the isopropyl alcohol after the liquid mixture film forming step by supplying the isopropyl alcohol to the front surface of the substrate.

2. The substrate treatment method according to claim 1, wherein the supply of the water and the isopropyl alcohol in the liquid mixture film forming step is started before the deceleration of the substrate from the first rotation speed is started.

3. The substrate treatment method according to claim 1, wherein the liquid mixture film forming step includes the step of reducing the rotation speed of the substrate held by the substrate holding unit in a plurality of stages including at least three stages.

4. The substrate treatment method according to claim 1, wherein the isopropyl alcohol replacing step includes a step of rotating the substrate held by the substrate holding unit at a third rotation speed that is higher than the second rotation speed.

5. The substrate treatment method according to claim 1, wherein the front surface of the substrate held by the substrate holding unit is at least partially hydrophobic.

6. The substrate treatment method according to claim 1, further comprising a heating step of supplying a back surface of the substrate with a warm water having a temperature higher than that of the isopropyl alcohol present on the front surface of the substrate simultaneously the isopropyl alcohol replacing step.

* * * * *